United States Patent
Mahajan et al.

(10) Patent No.: US 7,148,463 B2
(45) Date of Patent: Dec. 12, 2006

(54) INCREASED RESPONSIVITY PHOTODETECTOR

(75) Inventors: Aaditya Mahajan, Addison, TX (US);
Edward A. Beam, III, Plano, TX (US);
Jose L. Jiminez, Dallas, TX (US);
Andrew A. Ketterson, Dallas, TX (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 10/621,694

(22) Filed: Jul. 16, 2003

(65) Prior Publication Data

US 2005/0012030 A1   Jan. 20, 2005

(51) Int. Cl.
*H01J 40/14*   (2006.01)
(52) U.S. Cl. .................... 250/214.1; 257/288
(58) Field of Classification Search ........ 250/214.1;
257/288–291, 438, 458, 222, 225, 233, 257–258
See application file for complete search history.

(56) References Cited

U.S. PATENT DOCUMENTS

| | | | | |
|---|---|---|---|---|
| 4,218,143 A | * | 8/1980 | Bottka | 356/445 |
| 5,479,032 A | * | 12/1995 | Forrest et al. | 257/190 |
| 5,594,237 A | * | 1/1997 | Kulick et al. | 250/214.1 |
| 6,420,728 B1 | * | 7/2002 | Razeghi | 257/14 |
| 6,482,672 B1 | * | 11/2002 | Hoffman et al. | 438/94 |

OTHER PUBLICATIONS

Bollaert et al., "Metamorphic $In_{0.4}Al_{0.6}As/In_{0.4}Ga_{0.6}As$ HEMT's on GaAs Substrate", IEEE Electron Device Letters, vol. 20, No. 3, Mar. 1999, pp. 123-125.

Dumka et al., "High Performance 0.35 μm Gate-Length Monolithic Enhancement/Depletion-Mode Metamorphic $In_{0.52}Al_{0.48}As/In_{0.53}Ga_{0.47}As$ HEMTs on GaAs Substrates", IEEE Electron Device Letters, vol. 22, No. 8, Aug. 2001, pp. 364-366.

Hoke et al., "Molecular Beam Epitaxial Growth And Device Performance Of Metamorphic High Electron Mobility Transistor Structures", J. Vac. Sci. Technol. B, vol. 17, No. 3, May/Jun. 1999, pp. 1131-1135.

Jang et al., "Long Wavelength Metamorphic Double Heterojunction $In_{0.53}Ga_{0.47}As/InAlGaAs/In_{0.52}Al_{0.48}As$ Photodiodes On GaAs Substrates", Electronics Letters, vol. 37, No. 11, May 24, 2001.

Jang et al., "The Impact Of A Large Bandgap Drift Region In Long-Wavelength Metamorphic Photodiodes", IEEE Photonics Technology letters, vol. 13, No. 10, Oct. 2001, pp. 1097-1099.

(Continued)

*Primary Examiner*—Stephone B. Allen
*Assistant Examiner*—Patrick J. Lee
(74) *Attorney, Agent, or Firm*—Bever Hoffman & Harms, LLP

(57) ABSTRACT

A photodetector includes a high-indium-concentration (H-I-C) absorption layer having a Group III sublattice indium concentration greater than 53%. The H-I-C absorption layer improves responsivity without decreasing bandwidth. The photoconversion structure that includes the H-I-C absorption layer can be formed on any type of substrate through the use of a metamorphic buffer layer to provide a lattice constant gradient between the photoconversion structure and the substrate. The responsivity of the photodetector can be further improved by passing an incoming optical signal through the H-I-C absorption layer at least twice.

30 Claims, 5 Drawing Sheets

OTHER PUBLICATIONS

Jang et al., "Long-Wavelength $In_{0.53}Ga_{0.47}As$ Metamorphic p-i-n Photodiodes On GaAs Substrates", IEEE Photonics Technology Letters, vol. 13, No. 2, Feb. 2001, pp. 151-153.

Zaknoune et al., "InAlAs/InGaAs Metamorphic HEMT With High Current Density And High Breakdwon Voltage", IEEE Electron Device Letters, vol. 19, No. 9, Sep. 1998, pp. 345-347.

* cited by examiner

INCREASED RESPONSIVITY PHOTODETECTOR

BACKGROUND OF THE INVENTION

1. Field of the Invention

The invention relates to photodetectors, and in particular, to a structure and method for producing high-speed, high-responsivity photodetectors.

2. Related Art

A photodetector converts an optical signal into an electrical signal. Photodetectors are therefore critical components in optical communications networks. FIG. 1 shows a conventional photodetector 100 that includes a PIN photoconversion structure 120 formed on a substrate 110. Electrodes 101 and 102 provide electrical connectivity for photodetector 100.

PIN photoconversion structure 120 includes a p-type anode layer 129, an intrinsic (undoped) absorption layer 125, an n-type cathode layer 121, and an etch stop layer 121-E. Absorption layer 125 absorbs light (photons) from an optical signal 190 that passes through anode layer 129. If the absorbed photons have sufficient energy (shorter wavelengths correspond to higher energy photons), electron-hole pairs are generated within absorption layer 125. The free electrons and holes move in opposite directions (electrons towards n-type cathode layer and holes towards p-type anode layer 129), thereby generating an electrical signal that can be correlated to optical signal 190.

The specific materials used in a photodetector depend on the wavelength(s) of light included in optical signal 190. For example, carrier wavelengths in modern optical networks are typically in the range of 1.3 to 1.55 µm. Therefore, telecommunications photodiodes typically include an absorption layer formed from indium gallium arsenide (InGaAs), which provides strong absorption characteristics in the critical 1.3–1.55 µm wavelength range.

In particular, conventional telecommunications photodetectors include an absorption layer 125 composed of $In_{0.53}Ga_{0.47}As$, as indicated in FIG. 1, which includes Group III sublattice concentrations (mole fractions) of 53% indium and 47% gallium. Note that the Group III sublattice of absorption layer 125 is made up of only the Group III elements (i.e., elements from column III of the Periodic Table) in absorption layer 125 (i.e., indium and gallium). $In_{0.53}Ga_{0.47}As$ is used in conventional telecommunications photodetectors because it can be lattice-matched to an indium phosphide (InP) substrate 110, thereby ensuring the structural integrity of the photodetector.

For similar reasons, all the other components of photodetector 100 are also selected to have the same lattice constant as InP and $In_{0.53}Ga_{0.47}As$. For example, cathode layer 121 is an n-doped $In_{0.52}Al_{0.48}As$ layer, which has the same lattice constant as $In_{0.53}Ga_{0.47}As$, anode layer 129 is a p-doped $In_{0.53}Ga_{0.47}As$ layer, and etch stop layer 121-E is a thin InP layer. Etch stop layer 121-E is incorporated into PIN photoconversion structure 120 to simplify endpoint detection during the formation of cathode layer 121. Because etch processes are typically very selective, the InAlAs etch used to create cathode layer 121 essentially terminates at etch stop layer 121-E.

Reducing the vertical length (i.e., height or thickness) of absorption layer 125 in photodetector 100 generally increases the speed (bandwidth) of photodetector 100. The shortened absorption layer 125 means that charge carriers (i.e., the free electrons and holes) generated within absorption layer 125 in response to optical signal 190 have a shorter distance to travel to reach electrodes 101 and 102. This in turn means that photodetector 100 can respond to optical signals having higher modulation speeds.

In FIG. 1, the vertical length (i.e., thickness) of absorption layer 125 is indicated by length L1. The bitrate at which optical signal 190 can provide data to PIN photodetector 100 is therefore determined in large part by length L1. In general, reducing length L1 will increase the maximum bitrate (although at very small lengths L1, the capacitance of the device may limit further gains in bitrate). For example, conventional PIN photodetectors designed to support transmission rates (bitrates) of 40 Gb/s at a wavelength of 1.55 µm typically have an absorption layer 125 having a length (L1) of roughly 7000 Å.

Unfortunately, reducing the vertical length L1 of absorption layer 125 also reduces the responsivity of photodetector 100, since a thinner absorption layer absorbs less of incident optical signal 190 than a thick absorption layer. Therefore, as the vertical length of absorption layer 125 is reduced to improve detection speed, the detection efficiency, or responsivity, of photodetector 100 is reduced.

For example, if vertical length L1 is 1.4 µm, photodetector 100 will absorb roughly 61% of incoming optical signal 190. However, to support a 40 Gb/s transmission rate, absorption layer 125 in conventional photodetector 100 must be reduced to a vertical length L1 of 7000 Å. At this vertical length (thickness), absorption layer 125 will only absorb about 38% of incident optical signal 190. Consequently, conventional high-speed PIN photodetectors have difficulty detecting low-level optical signals.

To increase the responsivity of a PIN photodetector, a resonant-cavity approach can be used, in which reflective layers are formed that surround the absorption layer of the photodiode. When light is coupled into this resonant-cavity enhanced (RCE) photodetector, part of it is absorbed in the InGaAs absorption layer. The remainder passes down the detector until it is reflected back towards the absorption layer by the lower reflector. Some of this reflected light is absorbed in the absorption layer, while the remainder keeps traveling until it is reflected back towards the absorption layer by the upper reflector. This process continues until virtually all the light is absorbed.

Because an incoming optical signal passes through the absorption layer several times, an RCE photodetector with a thin absorption layer can still provide good responsivity. However, RCE photodetectors are often only useful for a very narrow band of wavelengths, since the semiconductor layers that are commonly used as the reflective layers are typcially only reflective over a narrow range of wavelengths. Furthermore, RCE photodetectors can be difficult to manufacture, due to the need for the additional reflective layers.

In an effort to overcome the limitations of conventional PIN photodetectors, other types of photoconversion structures are sometimes used. For example, in a waveguide PIN (WGPIN) structure, the optical signal is coupled into the edge of the detector (and therefore the edge of the absorption layer). Decreasing the vertical length (thickness) of the absorption layer in a WGPIN photodetector to improve bandwidth therefore does not significantly degrade responsivity, since the horizontal length of the absorption layer is not changed. Therefore, a WGPIN photodetector can provide both high responsivity and high bandwidth.

However, WGPIN photodetectors generally exhibit increased polarization dependent loss (PDL) as compared to other detectors, resulting in problematic signal distortion. Additionally, from a packaging standpoint, trying to successfully couple light from an optical fiber into a WGPIN detector can be difficult and time-consuming, which can signficantly raise the implementation cost of such photodetectors.

Accordingly, it is desirable to provide a method and structure for efficiently producing high-speed, high-responsivity photodetectors.

SUMMARY OF THE INVENTION

According to an embodiment of the invention, a "high-indium-concentration" (H-I-C) absorption layer in a photodetector is created by raising the Group III sublattice concentration of indium ("indium concentration") in the InGaAs absorption layer of the photodetector to a value greater than 53%. The increased indium concentration raises the density of allowable energy states in the absorption layer, which in turn increases the responsivity of a photodetector that includes the H-I-C absorption layer.

Because this increase in responsivity is achieved without increasing the vertical length of the absorption layer, the H-I-C absorption layer provides increased photodetector responsivity without sacrificing bandwidth. According to various embodiments of the invention, an H-I-C absorption layer can be incorporated into various types of photodetectors, including PIN (mesa-based or planar-diffused), dual path PIN, waveguide PIN, RCE, avalanche (also mesa-based or planar-diffused), and metal-substrate-metal (MSM) photodetectors, among others.

Because changing the indium concentration in the absorption layer can change the lattice constant of the absorption layer, various embodiments of the invention include attachment interface structures to allow the formation of high-indium-concentration (H-I-C) photoconversion structures on substrates having different lattice constants. For example, according to an embodiment of the invention, a photodetector includes a photoconversion structure and a substrate having different lattice constants, and a metamorphic buffer layer that is disposed between the photoconversion structure and the substrate. The composition of the metamorphic buffer layer grades from the lattice constant of the substrate to the lattice constant of the photoconversion structure, thereby maintaining the structural integrity of the photodetector.

The invention will be more fully understood in view of the following description of the exemplary embodiments and the drawings thereof.

DETAILED DESCRIPTION

Figure 2:
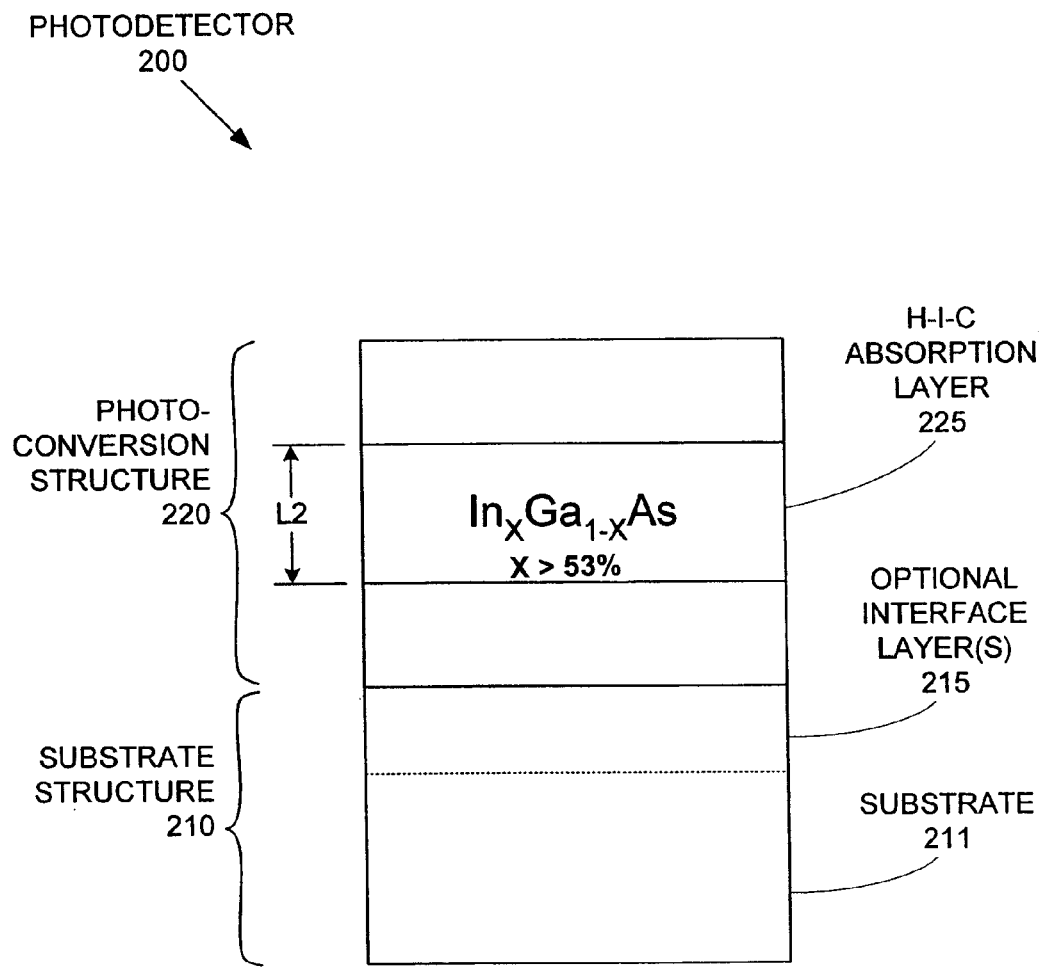
FIG. 2 is a cross-section of a photodetector having an H-I-C InGaAs absorption layer, according to an embodiment of the invention.

FIG. 2 shows a cross-section of a photodetector 200 in accordance with an embodiment of the invention. Photodetector 200 includes a photoconversion structure 220 on a substrate structure 210. Photoconversion structure 220 performs the optical-to-electrical signal conversion, and includes a high-indium-concentration (H-I-C) absorption layer 225 formed from InGaAs. Specifically, H-I-C absorption layer 225 is formed from an $In_xGa_{1-x}As$ layer, where X is between 0.53 and 1.0. That is, the Group III sublattice concentration of indium is greater than 53% and less than 100%.

H-I-C absorption layer 225 is typically a non-intentionally doped (NID) layer. Note that photoconversion structure 220 can comprise any type of photoconversion structure (e.g., PIN (mesa-based or planar-diffused), dual path PIN, waveguide PIN, RCE, avalanche (also mesa-based or planar-diffused), and MSM photodiodes). Note further that substrate structure 210 can comprise an optional interface layer(s) 215 that accommodates any lattice constant difference between substrate 211 and photoconversion structure 220, as described in further detail below.

Because H-I-C absorption layer 225 has a higher indium concentration than the $In_{0.53}Ga_{0.47}As$ absorption layers used in conventional photodetectors, H-I-C absorption layer 225 provides a greater density of allowable energy states for electrons than does a conventional absorption layer. This in turn allows H-I-C absorption layer 225 to capture a greater portion of an incident optical signal than a conventional absorption layer would be be able to capture, thereby increasing the responsivity of photodetector 200 over conventional photodetectors.

Table 1 shows a set of simulation data that indicates improvements in responsivity that can be achieved via the use of an H-I-C absorption layer such as shown in FIG. 2. The data represents responsivity performance for a PIN photodetector with an absorption layer having a thickness (L2) of 7000 Å and a p-type anode layer having a thickness of 500 Å.

TABLE 1

INDIUM CONCENTRATION EFFECT ON RESPONSIVITY

| # | Absorption Layer Composition | Responsivity ($\lambda$ = 1.55 μm) | Responsivity ($\lambda$ = 1.3 μm) |
|---|---|---|---|
| 1 | $In_{0.53}Ga_{0.47}As$ | 0.4540 A/W | 0.5458 A/W |
| 2 | $In_{0.55}Ga_{0.45}As$ | 0.5150 A/W | 0.5486 A/W |
| 3 | $In_{0.57}Ga_{0.43}As$ | 0.5501 A/W | 0.5515 A/W |
| 4 | $In_{0.59}Ga_{0.41}As$ | 0.5750 A/W | 0.5515 A/W |
| 5 | $In_{0.61}Ga_{0.39}As$ | 0.5909 A/W | 0.5487 A/W |
| 6 | $In_{0.63}Ga_{0.37}As$ | 0.5998 A/W | 0.5458 A/W |

Figure 1:
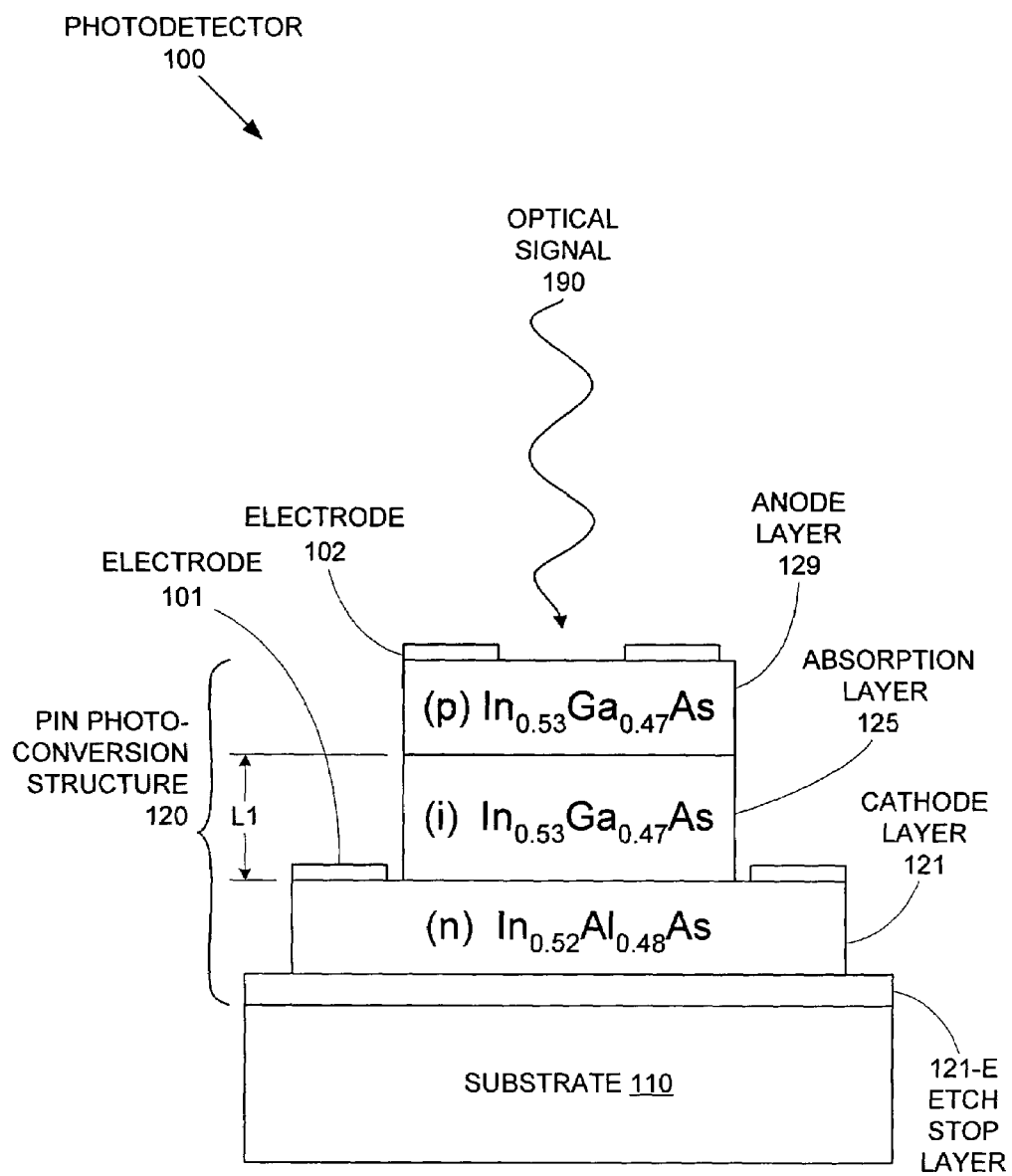
FIG. 1 is a cross-section of a conventional PIN photodetector with an $In_{0.53}Ga_{0.47}As$ absorption layer.

Row #1 of Table 1 lists the baseline responsivity performance for a conventional absorption layer (i.e., absorption layer 125 of FIG. 1, which has a 53% indium concentration). Thus, for optical signals having wavelengths of 1.55 μm and 1.3 μm, the conventional absorption layer in Row #1 provides responsivities of 0.4540 A/W and 0.5458 A/W, respectively.

Meanwhile, rows #2–6 of Table 1 list the responsivity performance provided by H-I-C absorption layers (e.g., absorption layer 225 of FIG. 2) having increasing indium concentrations, according to various embodiments of the invention. For example, simply increasing the indium concentration to 55% as shown in Row #2 increases the responsivity at 1.55 μm to 0.5150 A/W—an increase of more than 13% over the conventional responsivity shown in Row #1. Raising the indium concentration to 63% (Row #6) provides a 1.55 μm responsivity of 0.5998 A/W—a more than 30% improvement. Thus, according to an embodiment of the invention, a photodetector 200 to be used with a 1.55 μm carrier wavelength could include a H-I-C absorption layer 225 having an indium concentration between 54–64%, inclusive (i.e., greater than or equal to 54% and less than or equal to 64%).

Note that, the data shown in Table 1 indicates that responsivity does not follow a linear relationship with indium concentration, and that increasing indium concentration beyond a certain point can result in diminishing returns. For example, at a carrier wavelength of 1.55 μm, the responsivity increase in moving from an indium concentration of 61% (row #5) and to an indium concentration of 63% (row #6) is only 0.0089 A/W—a mere 1.5% increase in responsivity compared to the >13% increase obtained in moving from an indium concentration of 53% (row #1) to 55% (row #2).

Note further that, in certain situations, a high indium concentration in absorption layer 225 (e.g., greater than 80%, 70%, or even in some cases 64%) can detrimentally lower the breakdown voltage and increase leakage currents in photodetector 200. Therefore, production parameters (i.e., temperatures, gas flows and ratios) used in the formation of H-I-C absorption layer 225 should be selected to optimize responsivity based on the incremental benefits associated with additional increases in indium concentration.

For example, the decreasing rate of improvement shown in Table 1 as indium concentration is increased from 59% to 61% to 63% indicates that increasing the indium concentration much further may not provide significant responsivity improvements. Therefore, according to an embodiment of the invention, a photodetector 200 to be used with a 1.55 μm carrier wavelength would preferably include a H-I-C absorption layer 225 having an indium concentration between 61–64%, inclusive.

Note further that, for a carrier wavelength of 1.3 μm, the responsivity actually goes down as indium concentration is increased above 59% (row #4). Therefore, according to another embodiment of the invention, a photodetector 200 to be used with a 1.3 μm carrier wavelength would preferably include a H-I-C absorption layer 225 having an indium concentration between 57–59%, inclusive.

However, photodetectors are sometimes used to detect multiple different carrier wavelengths. Thus, according to another embodiment of the invention, a photodetector 200 to be used with both 1.3 μm and 1.55 μm carrier wavelengths would incorporate a H-I-C absorption layer 225 having an indium concentrations in the 61–64% range, inclusive, to provide the best balance of responsivities at both carrier wavelengths.

Figure 3A:
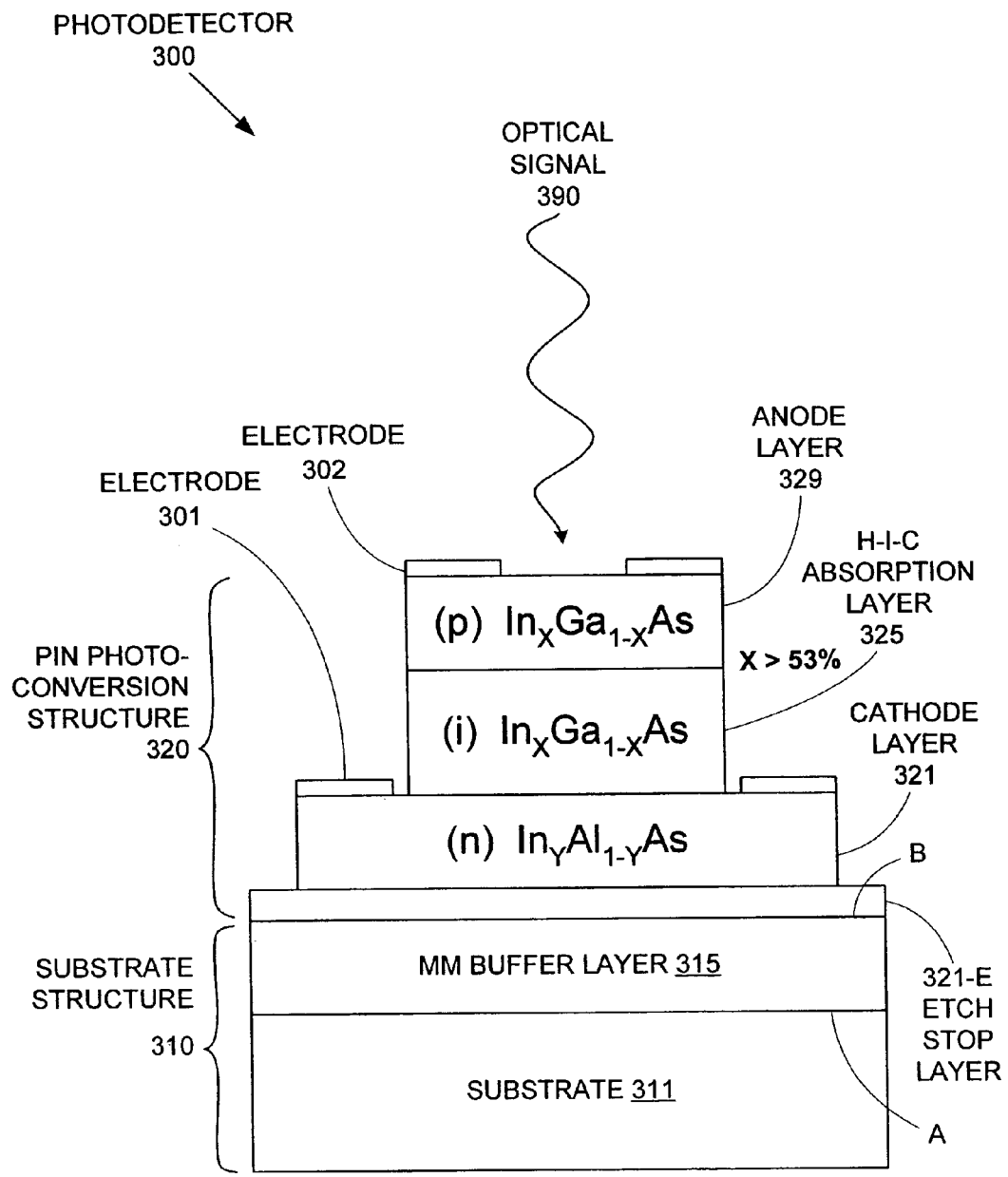
FIG. 3A is a cross-section of a PIN photodetector having an H-I-C InGaAs absorption layer and a metamorphic buffer layer, according to an embodiment of the invention.

FIG. 3A shows a photodetector 300 in accordance with another embodiment of the invention. Photodetector 300 includes a PIN photoconversion structure 320 formed on a substrate structure 310. PIN photoconversion structure 320 includes an anode layer 329 (p-type), an H-I-C absorption layer 325 (intrinsic, or undoped), a cathode layer 321 (n-type), and an optional etch stop layer 321-E (for endpoint detection when forming cathode layer 321). Free electrons and holes generated within H-I-C absorption layer 325 in response to an incident optical signal 390 flow towards cathode layer 321 and anode layer 329, respectively, thereby generating an electrical signal that can be detected across electrodes 302 and 301.

Just as with H-I-C absorption layer 225 of FIG. 2, H-I-C absorption layer 325 is a NID $In_xGa_{1-x}As$ layer, where X is greater than 0.53 (53%). Anode layer 329 is formed from p-doped InGaAs having the same $In_xGa_{1-x}As$ composition to ensure that anode layer 329 is lattice-matched to H-I-C absorption layer 325. The precise composition of n-doped $In_YAl_{1-Y}As$ cathode layer 321 (0<Y<1) is likewise selected so that cathode layer 321 can be lattice-matched to H-I-C absorption layer 325. For example, both X and Y could be selected to be 0.63, which since InGaAs with a 63% indium concentration ($In_{0.63}Ga_{0.37}As$) has the same lattice constant as InAlAs with a 63% indium concentration ($In_{0.63}Al_{0.37}As$).

Optional etch stop layer 321-E, if present in photoconversion structure 320, is selected to be a material different than that of cathode layer 321 but having the same lattice constant as cathode layer 321. For example, since cathode layer 321 is formed from $In_YAl_{1-Y}As$ in FIG. 3A, etch stop layer 321-E could be formed from $In_xGa_{1-x}As$ (like H-I-C absorption layer 325 and anode layer 329). Then, the InAlAs etch process used to form cathode layer 321 would terminate once it reached InGaAs etch stop layer 321-E.

Note that since all the layers of photoconversion structure 320 are lattice-matched, the lattice constant of photoconversion structure 320 is the same as that of any of anode layer 325, H-I-C absorption layer 325, and cathode layer 321 (and etch stop layer 321-E, if present). However, because the indium concentration in H-I-C absorption layer 325 is not equal to the standard 53%, photoconversion structure 320 cannot be lattice-matched to a conventional InP substrate. Therefore, substrate structure 310 includes a metamorphic buffer layer 315 between photoconversion structure 320 and a substrate 311.

Metamorphic buffer layer 315 has a varying composition that results in a lattice constant that grades from approximately the lattice constant of substrate 311 to approximately the lattice constant of photoconversion structure 320, so that metamorphic buffer layer 315 can be lattice matched to both substrate 311 and photoconversion structure 320. For example, according to an embodiment of the invention, metamorphic buffer layer 315 is preferably matched with photoconversion structure 320 to within 0.001, according to Equation 1, below:

$$M = (Cp - Cmm)/Cp \qquad 1$$

wherein M is the mismatch (e.g., 0.001), Cp is the lattice constant of photoconversion structure 320, and Cmm is the lattice constant of metamorphic buffer layer 315.

Strain in metamorphic buffer layer 315 resulting from its varying composition is relaxed by dislocations. Note that the number of such dislocations and associated defects in metamorphic buffer layer 315 can be minimized by selecting a sufficiently gradual composition gradation, as described in co-owned, co-pending U.S. patent application Ser. No. 09/834,832, filed on Apr. 13, 2001, which is herein incorporated by reference in its entirety.

For example, metamorphic buffer layer 315 could comprise an $In_zAl_{1-z}As$ (0<Z<1) layer formed on a GaAs substrate 311, where the Group III sublattice concentration of indium (i.e., Z) varies according to position relative to substrate 311 and photoconversion structure 320. Note that this indium concentration variation can be a linear variation, an exponential variation, a variation by discrete steps, or any other type of variation that provides the desired lattice constant variation.

For example, metamorphic buffer layer 315 can have a lower surface A in contact with substrate 311 and an upper surface B in contact with photoconversion structure 320. Then, according to an embodiment of the invention, the mole fraction of indium (i.e., indium concentration) in metamorphic buffer layer 315 could vary monotonically in a linear or exponential manner between surfaces A and B, such that the lattice constant of metamorphic buffer layer 315 at surface A is the same as the lattice constant of substrate 311, and the lattice constant of metamorphic buffer layer 315 at surface B is the same as the lattice constant of photoconversion structure 320.

According to another embodiment of the invention, the mole fraction of indium may vary in a non-monotonic manner. For example, the mole fraction of indium may increase from a value x1 at surface A to a value x2 at a position between surfaces A and B, and then decrease to a value x3 (i.e., x3<x2) at surface B. According to another embodiment of the invention, the mole fraction of indium metamorphic buffer layer 315 can vary in a step wise manner in steps having a thickness of about 100 Å to about 1000 Å. Thus, any function of indium concentration variation can be used so long as the lattice constants at surfaces A and B of metamorphic buffer layer 315 match the lattice constants of substrate 311 and photoconversion structure 320, respectively.

A 1500 Å to 2 μm thick metamorphic buffer layer can typically accommodate most lattice constant differences between substrate 311 and photoconversion structure 320. An InAlAs metamorphic buffer layer can be grown from indium, aluminum, and arsenic sources at a substrate temperature between about 380° C. and about 420° C.—preferably about 400° C. A desired composition profile for the metamorphic buffer layer can be achieved by controlling the flux of these precursor materials during the growth process. For example, by holding the flux of aluminum constant while varying the ratio of the flux of aluminum and the flux of arsenic, the Group III sublattice concentration of indium can be varied. Note that, according to various embodiments of the invention, metamorphic buffer layer 315 can also be doped (i.e., electrically conductive) or undoped (i.e., electrically non-conductive), depending on the electrical requirements of photodetector 300.

By providing this "lattice constant gradient" between substrate 311 and photoconversion structure 320, metamorphic buffer layer 315 maintains the mechanical integrity of a photodetector incorporating a H-I-C absorption layer, even when the H-I-C absorption layer has a different lattice constant than the substrate. Metamorphic buffer layer 315 therefore allows substrate 311 to comprise any material (e.g., InP, GaAs (gallium arsenide), or even silicon).

Figure 3B:
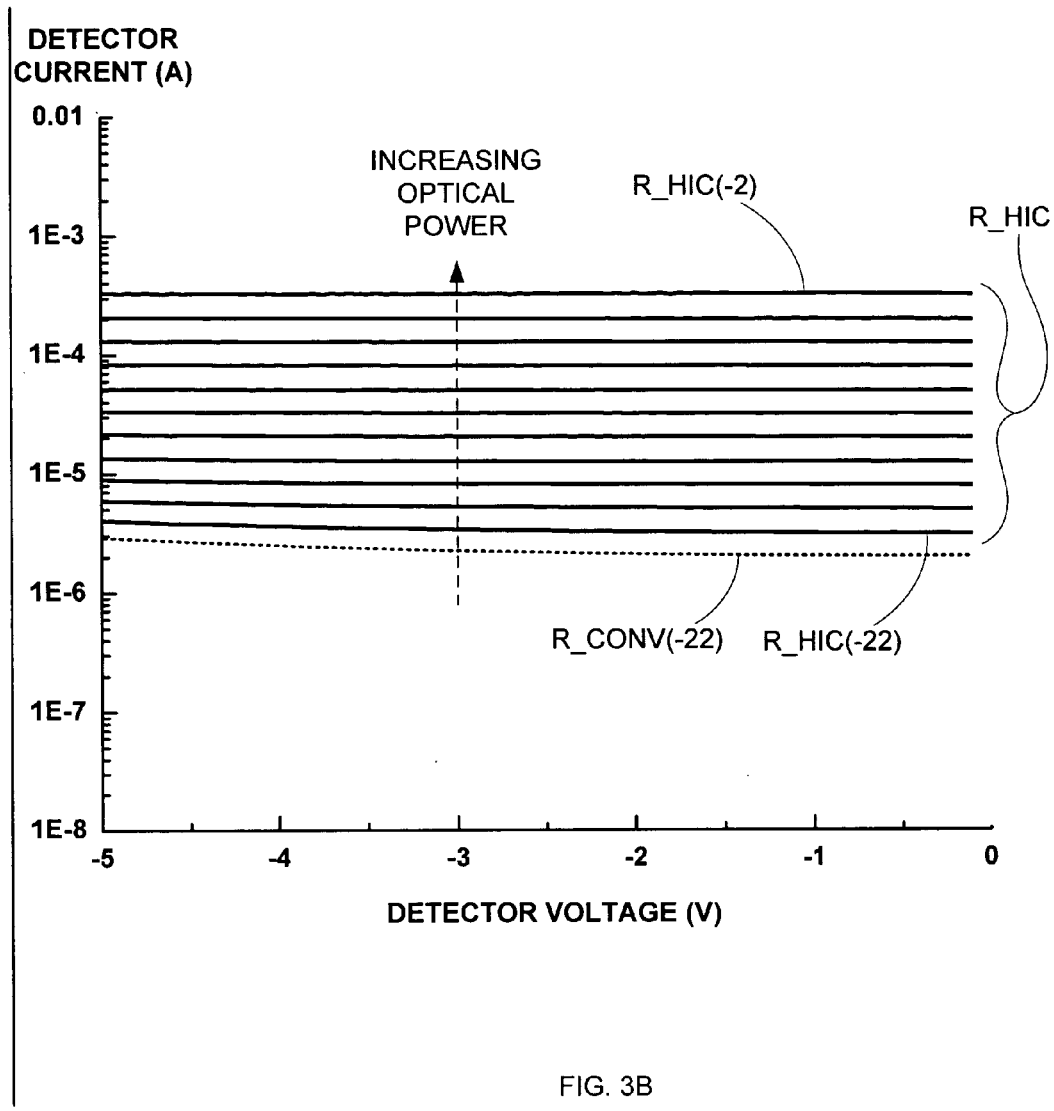
FIG. 3B is a graph of response curves for a photodetector having an H-I-C InGaAs absorption layer, according to an embodiment of the invention.

FIG. 3B is a graph of DC (direct current) response curves R_HIC for a photodetector substantially similar to photodetector 3 shown in FIG. 300. Specifically, response curves R_HIC are taken from a photodetector having a 500 Å anode layer 329, a 7000 Å $In_{0.63}Ga_{0.37}As$ H-I-C absorption layer 325, and a 2000 Å $In_{0.63}Al_{0.37}As$ cathode layer 321, all formed on a metamorphic buffer layer 315 providing a lattice constant gradient between the cathode layer and a GaAs substrate.

DC response curves R_HIC are shown for a range of different optical power levels (as indicated by the vertical arrow). For example, a detector current of roughly $3.2\times10^{-4}$ A is produced in response to a signal having an optical power of −2 dBm (as indicated by curve P_HIC(−2)), while a detector current of roughly $4.0\times10^{-6}$A is produced in response to a signal having an optical power of −22 dBm (as indicated by curve P_HIC(−22)).

In contrast, a conventional photodetector (FIG. 1) having an $In_{0.53}Ga_{0.47}As$ absorption layer but otherwise similar dimensions (i.e., 500 Å anode layer 129, 7000 Å absorption layer 125, and 2000 Å cathode layer 121) would exhibit much lower detector currents at each optical power level. For example, such a conventional photodetector produces a detector current of roughly $3.0\times10^{-6}$Å in response to a signal having an optical power of −22 dBm (as indicated by dotted-line curve R_CONV(−22)). This is approximately 25% less current than generated by the photodetector incorporating the H-I-C absorption layer 325 (or 225, shown in FIG. 2). A similar disparity exists at each different optical power level.

Figure 4:
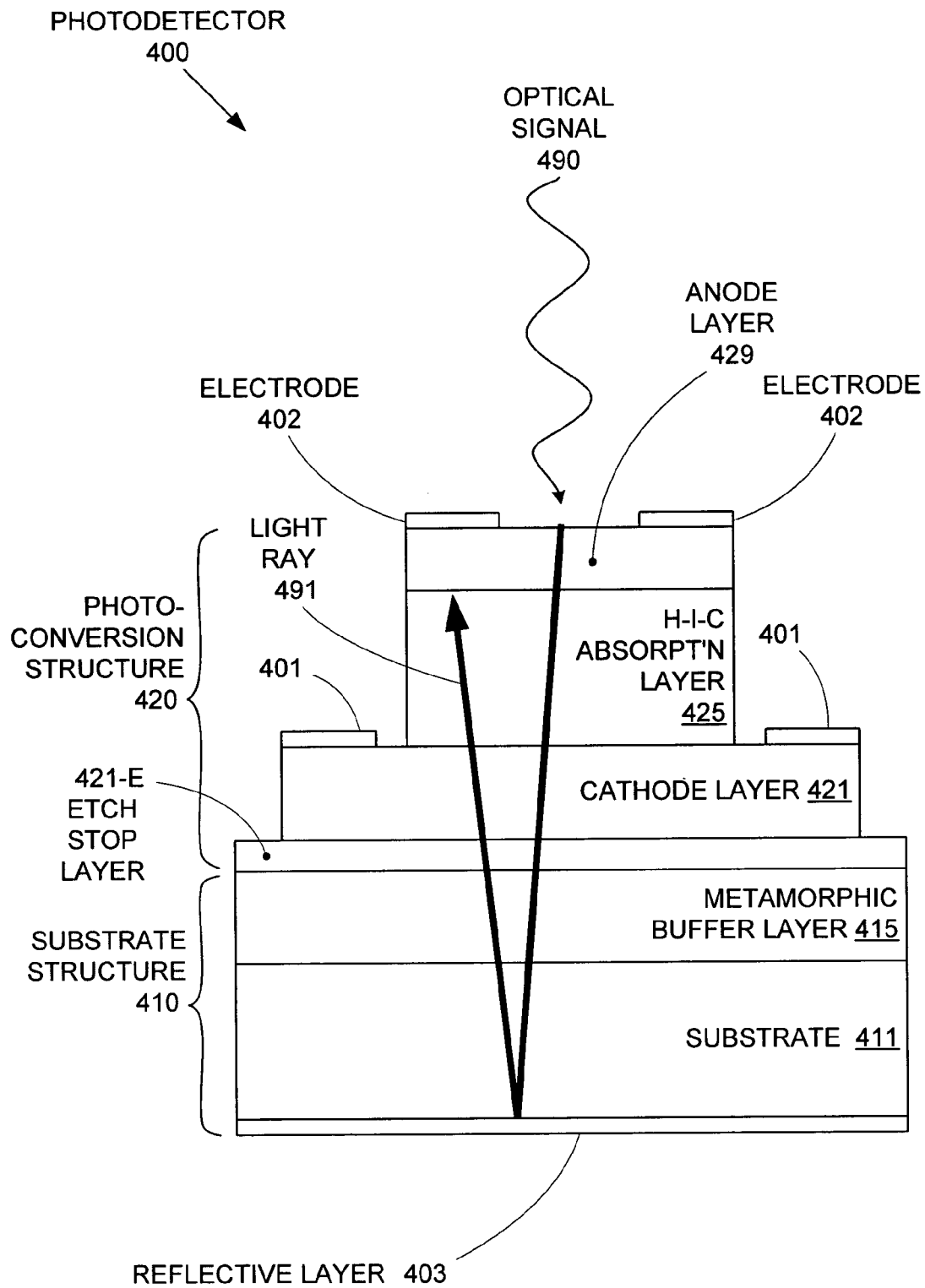
FIG. 4 is a cross-section of a dual path PIN photodetector having an H-I-C InGaAs absorption layer and a metamorphic buffer layer, according to an embodiment of the invention.

FIG. 4 shows a photodetector 400 in accordance with another embodiment of the invention. Photodetector 400 includes a PIN photoconversion structure 420 formed on a substrate structure 410. PIN photoconversion structure 420 includes an anode layer 429, an H-I-C absorption layer 425, a cathode layer 421, and an optional etch stop layer 421-E for simplifying endpoint detection when forming cathode layer 421. Free electrons and holes generated within H-I-C absorption layer 425 in response to an incident optical signal 490 flow towards cathode layer 421 and anode layer 429, respectively, thereby generating an electrical signal that can be detected across electrodes 402 and 401.

According to an embodiment of the invention, the material compositions of anode layer 421, H-I-C absorption layer 425, and cathode layer 429 are substantially similar to those of anode layer 321, H-I-C absorption layer 325, and cathode layer 329, respectively, of photoconversion structure 320 shown in FIG. 3. Likewise, a metamorphic buffer layer 415 included in substrate structure 410 is substantially similar to metamorphic buffer layer 315 shown in FIG. 3. The composition of metamorphic buffer layer 415 grades from the lattice constant of substrate 411 to the lattice constant of photoconversion structure 420 (e.g., the lattice constant of H-I-C absorption layer 425).

However, unlike photodetector 300 shown in FIG. 3, photodetector 400 includes a reflective layer 403 on the backside of substrate 411 that reflects any light rays from optical signal 490 that reach substrate 411. For example, light ray 491 from optical signal 490 enters photodetector 400 through anode layer 429 and passes through H-I-C absorption layer 425 a first time. The unabsorbed portion of light ray 491 then continues through cathode layer 421, metamorphic buffer layer 415, and substrate 411, until it is reflected by reflective layer 403. Light ray 491 then makes a return path through photodetector 400 and passes through H-I-C absorption layer 425 a second time. Photodetector 400 can therefore be termed a "dual path" photodetector.

Because optical signals (such as light ray 419) pass through H-I-C absorption layer 425 twice, the responsivity of dual path photodetector 400 can almost be doubled over "single path" photodetectors (i.e., photodetectors without reflective layer 403). By reducing the thickness of substrate 411, the path of light ray 491 through photodetector 400 is shortened, which can further improve the responsivity of dual path photodetector 400. Table 2 presents simulation data indicating the type of responsivity improvements that can be achieved through the use of various dual path geometries.

TABLE 2

Single Path versus Dual Path Responsivity

| # | Description | Absorption Layer Comp. | Substrate Thickness | Responsivity |
|---|---|---|---|---|
| 1 | Single Path: Conventional Structure | $In_{0.53}Ga_{0.47}As$ | 400 μm | 0.454 A/W |
| 2 | Single Path: H-I-C Absorp. Layer | $In_{0.63}Ga_{0.37}As$ | 400 μm | 0.600 A/W |
| 3 | Dual Path: H-I-C Absorp. Layer w/Thinned Substrate 1 | $In_{0.63}Ga_{0.37}As$ | 100 μm | 0.760 A/W |
| 4 | Dual Path: H-I-C Absorp. Layer w/Thinned Substrate 2 | $In_{0.63}Ga_{0.37}As$ | 50 μm | 0.83 A/W |

Each photodetector listed in Table 2 includes a 500 Å anode layer, a 7000 Å absorption layer for use with a 1.55 μpm carrier wavelength, and a 3000 Å cathode layer. In Row #1, the baseline responsivity for a conventional single path photodetector having an $In_{0.53}Ga_{0.47}As$ absorption layer (and a conventional substrate thickness of 400 μm) is listed as 0.454 A/W (consistent with the data from Row #1 of Table 1). As indicated in Row #2, simply increasing the absorption layer indium concentration can raise the responsivity of the photodetector to 0.600 A/W (consistent with the data from Row #6 of Table 1).

However, even greater responsivity improvements can be achieved by implementing a dual path geometry (with thinned substrate) as indicated by Rows #3 and #4. In Row #3, a responsivity of 0.760 A/W is listed for a dual path photodetector such as photodetector 400 shown in FIG. 4 that includes a H-I-C absorption layer and a reduced substrate thickness of 100 μm. Reducing substrate thickness in a dual path photodetector beneficially reduces signal loss within the substrate for any reflected optical signal. Thus, by reducing the substrate thickness even further to 50 μm can increase the responsivity of the photodetector to 0.83 A/W, as shown in Row #4.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A photodetector comprising a photoconversion structure, the photoconversion structure comprising:
   an indium gallium arsenide (lnGaAs) absorption layer, the lnGaAs absorption layer having a Group III sublattice indium concentration greater than 53 percent;
   a substrate;
   a p-type anode layer;
   a n-type cathode layer, wherein the lnGaAs absorption layer is disposed between the p-type anode layer and the n-type cathode layer; and
   an etch stop layer, wherein the photodetector includes a metamorphic buffer layer disposed between the photoconversion structure and the substrate, and wherein the etch stop layer is disposed between the n-type cathode layer and the metamorphic buffer layer.

2. The photodetector of claim 1, wherein the metamorphic buffer layer has a varying composition such that the metamorphic buffer layer is lattice matched to the photoconversion structure and the substrate.

3. The photodetector of claim 1, wherein the photoconversion structure has a first lattice constant, and the substrate has a second lattice constant, wherein the metamorphic buffer layer has a varying composition such that a lattice constant of the metamorphic buffer layer grades from approximately the first lattice constant to approximately the second lattice constant.

4. The photodetector of claim 3, wherein the photoconversion structure comprises one of a PIN diode, a waveguide PIN diode, a resonant cavity enhanced diode, an avalanche diode, and a metal-semiconductor-metal photodiode.

5. The photodetector of claim 3, wherein the Group III sublattice indium concentration is between 54% and 64%, inclusive.

6. The photodetector of claim 3, wherein the Group III sublattice indium concentration is between 61% and 64%, inclusive.

7. The photodetector of claim 3, wherein the Group III sublattice indium concentration is between 57% and 59%, inclusive.

8. The photodetector of claim 1, further comprising a reflective layer, wherein the substrate is disposed between the reflective layer and the photoconversion structure, the reflective layer being adapted to reflect light transmitted by the InGaAs absorption layer back into the InGaAs absorption layer.

9. The photodetector of claim 3, wherein the substrate comprises gallium arsenide, and
   wherein the metamorphic buffer layer comprises indium aluminum arsenide having a Group III sublattice concentration of indium that varies according to position relative to the substrate and the photoconversion structure.

10. A method for creating a photodetector, the method comprising:
    forming an indium gallium arsenide (InGaAs) absorption layer for a photoconversion structure such that the LnGaAs absorption layer has a Group III sublattice indium concentration greater than 53%;
    providing a substrate, wherein the substrate comprises a first surface and a second surface;
    forming a metamorphic buffer layer on the substrate, comprising:
       maintaining the substrate at a temperature between 380° C. and about 420° C.;
       supplying a flux of aluminum, a flux of arsenic, and a flux of indium to the substrate; and
       varying a ratio of the flux of arsenic and the flux of indium; and
    forming a reflective layer on the first surface, the reflective layer being adapted to reflect light transmitted by the InGaAs absorption layer back into the InGaAs absorption layer.

11. The method of claim 10, wherein forming the InGaAs absorption layer comprises controlling production parameters such that the Group III sublattice indium concentration of the InGaAs absorption layer is between 54% and 64%, inclusive.

12. The method of claim 10, wherein forming the InGaAs absorption layer comprises controlling production parameters such that the Group III sublattice indium concentration of the InGaAs absorption layer is between 61% and 64%, inclusive.

13. The method of claim 10, wherein forming the InGaAs absorption layer comprises controlling production parameters such that the Group III sublattice indium concentration of the InGaAs absorption layer is between 57% and 59%, inclusive.

14. The method of claim 10, further comprising:
forming a metamorphic buffer layer on the substrate; and
forming the photoconversion structure on the metamorphic buffer layer, and wherein the metamorphic buffer layer has a varying composition such that a lattice constant of the metamorphic buffer layer is lattice matched to the substrate and the photoconversion structure.

15. The method of claim 10, wherein the substrate has a first lattice constant, further comprising:
forming the photoconversion structure on the metamorphic buffer layer, wherein the photoconversion structure has a second lattice constant, and wherein the metamorphic buffer layer has a varying composition such that a lattice constant of the metamorphic buffer layer grades from the first lattice constant to the second lattice constant.

16. The method of claim 15, wherein the substrate comprises gallium arsenide.

17. The method of claim 15, wherein the metamorphic buffer layer is formed in the second surface.

18. The method of claim 17, further comprising thinning the substrate before forming the reflective layer.

19. A photodetector for converting an optical signal into an electrical signal, the photodetector comprising:
a substrate structure, wherein the substrate structure comprises:
a substrate layer; and
a metamorphic buffer layer formed on the substrate layer; and
a photoconversion structure formed on the substrate structure, the photoconversion structure comprising:
an indium gallium arsenide (InGaAs) absorption layer having a Group III sublattice indium concentration greater than 53%;
a p-type anode layer;
a n-type cathode layer, wherein the InGaAs absorption layer is disposed between the p-type anode layer and the n-type cathode layer; and
an etch stop layer, the etch stop layer being disposed between the n-type cathode layer and the metamorphic buffer layer.

20. The photodetector of claim 19, wherein the Group III sublattice indium concentration is less or equal to 64%.

21. The photodetector of claim 19, wherein the optical signal comprises light at a wavelength of 1.55 μm, and wherein the Group III sublattice indium concentration is between 61% and 64%, inclusive.

22. The photodetector of claim 21, wherein the optical signal further comprises light at a wavelength of 1.3 μm.

23. The photodetector of claim 19, wherein the optical signal comprises light at a wavelength of 1.3 μm, and wherein the Group III sublattice indium concentration is between 57% and 59%, inclusive.

24. The photodetector of claim 19, wherein the substrate structure comprises:
a substrate layer
wherein the metamorphic buffer has a first surface and a second surface,
wherein the first surface is in contact with the photoconversion structure and the second surface is in contact with the substrate layer, and
wherein the metamorphic buffer layer has a varying composition such that the first surface is lattice matched with the photoconversion structure and the second surface is lattice matched with the substrate layer.

25. The photodetector of claim 19, wherein the photoconversion structure has a first lattice constant equal to a lattice constant of the InGaAs absorption layer, and wherein the substrate layer has a second lattice constant,
and wherein the metamorphic buffer layer has a first surface and a second surface, wherein the first surface is in contact with the photoconversion structure and the second surface is in contact with the substrate layer, and wherein the metamorphic buffer layer has a varying composition such that a lattice constant of the metamorphic buffer layer grades from the first lattice constant at the first surface to the second lattice constant at the second surface.

26. The photodetector of claim 25, wherein the substrate comprises gallium arsenide,
wherein the metamorphic buffer layer comprises indium aluminum arsenide (InAlAs),
wherein the n-type cathode layer comprises InAlAs, and
wherein the p-type anode layer comprises InGaAs.

27. The photodetector of claim 26, wherein a thickness of the metamorphic buffer layer is between 1500 Å to 2 μm, and wherein a thickness of the InGaAs absorption layer is substantially equal to 7000 Å.

28. The photodetector of claim 27, wherein the substrate structure further comprises a reflective layer, the reflective layer being reflective to the optical signal, and wherein the substrate layer is disposed between the reflective layer and the metamorphic buffer layer.

29. The photodetector of claim 28, wherein the substrate layer is 100 μm thick or less.

30. The photodetector of claim 28, wherein the substrate layer is 50 μm thick or less.

* * * * *